United States Patent
Fischer

(10) Patent No.: US 7,046,704 B2
(45) Date of Patent: May 16, 2006

(54) TUNABLE LASER WITH A FIXED AND STABLE WAVELENGTH GRID ESPECIALLY USEFUL FOR WDM IN FIBER OPTIC COMMUNICATION SYSTEMS

(75) Inventor: Baruch Fischer, 17A Haaldel Umot Ha'Olam St., Haifa (IL) 32986

(73) Assignees: MRV Communication Ltd., Yoqneam Ilit (IL), part interest; Baruch Fischer, St. Haifa (IL), part interest ( * ) Notice: Subject to any disclaimer, the term of this patent is extended or adjusted under 35 U.S.C. 154(b) by 202 days.

(21) Appl. No.: 10/609,678

(22) Filed: Jul. 1, 2003

(65) Prior Publication Data
US 2004/0125831 A1    Jul. 1, 2004

Related U.S. Application Data

(60) Provisional application No. 60/392,301, filed on Jul. 1, 2002.

(51) Int. Cl.
    H01S 3/10    (2006.01)
(52) U.S. Cl. ............... 372/20; 327/18; 327/92; 327/99; 327/102
(58) Field of Classification Search .......... 372/18, 372/20, 92, 99, 102
    See application file for complete search history.

(56) References Cited

U.S. PATENT DOCUMENTS

| | | | |
|---|---|---|---|
| 5,870,417 A * | 2/1999 | Verdiell et al. | 372/32 |
| 6,389,047 B1 * | 5/2002 | Fischer | 372/32 |
| 6,654,390 B1 * | 11/2003 | Spiegelberg et al. | 372/6 |
| 6,816,518 B1 * | 11/2004 | Zimmerman | 372/20 |
| 6,862,136 B1 * | 3/2005 | Koren et al. | 359/344 |

FOREIGN PATENT DOCUMENTS

WO    WO99/39411    *  8/1999    ............ 372/32

* cited by examiner

Primary Examiner—Minsun Oh Harvey
Assistant Examiner—Delma R. Flores-Ruiz
(74) Attorney, Agent, or Firm—Edward Langer, Pat. Atty; Shiboleth, Yisraeli, Roberts, Zisman & Co.

(57) ABSTRACT

A wavelength tunable mode-locked laser system including a complex laser cavity comprising a broadband reflective mirror at one end and a wavelength chirped selective mirror at the other end. The system further includes a gain element and a low finesse Fabry-Perot etalon element inside the laser cavity. The gain element may be a semiconductor laser chip, with a broadband high reflection coating at one end and a partially reflecting coating at its other end. The gain element has a well-defined length, such that its longitudinal modes match a required optical frequency grid. The system also includes an active modulation element applied externally on said complex laser cavity to provide mode-locking of a specific cavity length among said defined predetermined cavity lengths, such that all possible optical frequencies emitted by the laser system are stabilized to the linear grid dictated by the Fabry-Perot longitudinal modes, that could be in accordance with the International Telecommunications Union Standards.

45 Claims, 3 Drawing Sheets

TUNABLE LASER WITH A FIXED AND STABLE WAVELENGTH GRID ESPECIALLY USEFUL FOR WDM IN FIBER OPTIC COMMUNICATION SYSTEMS

Claim(s) to Priority; U.S. Provisional patent application, filed Jul. 1, 2002, Ser. No. 60/392,301.

FIELD OF THE INVENTION

The present invention relates to fiber optic communication systems and devices, and other optical systems. More particularly the present invention relates to a system, which enables the introduction of many wavelengths in WDM (Wavelength Division Multiplexing) fiber optic communication systems, by use of a tunable source.

BACKGROUND OF THE INVENTION

Fiber-optic communications is a most important method of communications. A large amount of information is transferred via fiber optics systems. Examples of such communications beyond telephones are Internet and cable TV networks. The present commercial transmission rate of a single fiber with a single wavelength can reach as high as 10 Gb/second. A way to expand the transmission capacity is by the use of more than one wavelength on a single optical fiber. This technology is called WDM.

The state of the art in dense WDM (DWDM) systems allow hundreds of channels per fiber, and this capacity is expected to increase. Most of today's communication systems are known as passive systems, meaning that the particular wavelengths are assigned to particular addresses and there is a limited ability to change these dynamically during the communication. Dynamically tunable light sources that might be used for routing of optical information packets exist, however, today they are not well developed. For this purpose and others, it is needed to have a discrete grid of wavelengths that should be known to all nodes in the network. By using a plurality of wavelengths, it is possible to build many virtual connection paths between different nodes that are connected with each other using a small number of physical links. The separation between different channels is done using optical filtering (or wavelength de-multiplexing). Therefore, for communication uses, it is preferable that tunable laser sources are tuned within a stable discrete grid of wavelengths that are used in the optical network. There are also other needs for a tunable laser, such as the simple use as a spare to replace losers with any wavelength in the WDM system that stops functioning. A fast tunable laser is known in the art, as disclosed by Vljaysekhar Jayarman et al, IEEE JQE 29, p.92 (1993).

A fast tunable, mode-locked laser, as disclosed in U.S. Pat. No. 6,389,047 to Fischer, inventor of the present invention, is operated at particularly chosen wavelengths with the ability to switch from wavelength to wavelength. This patent provides for a collection of reflectors, which gradually increase or decrease in their central reflective wavelength. It allows selection and high speed switching between these wavelengths. This can be useful for dynamic wavelength division multiplexing (WDM) in which fiber optic communication systems having multiple wavelength channels in a single fiber, each channel carrying information which can be routed and processed independently. In one particular realization of the laser in this patent, the semiconductor gain element was high reflection coated at one end, thus producing a broadband reflecting mirror, and anti-reflection coated (ARC) at the other end, from which the cavity is extended into a complex fiber Bragg grating (FBG) mirror, consisting of a plurality of selective (in wavelength) reflectors (mirrors), one after the other. These reflectors define different lengths of the cavity. As a result, every cavity length has a different mode-locking frequency. Different cavity lengths, through their selective mirrors, in turn, define different wavelengths of the laser operation according to the associated selective mirror or fiber Bragg grating section that forms the cavity. Selecting the lasers operation wavelength is done by choosing and applying the mode locking frequency that matches the length of this cavity.

The prior art has several drawbacks that need to be addressed. To achieve accurate wavelengths, the spectral bandwidth of the Bragg reflectors has to be narrow, thus the overall plurality of reflectors has to be quite long. That is, for the laser to support a large number of wavelengths, a relatively long multiple element Bragg reflector is required, consisting of many different reflectors positioned one after another. This causes large discrepancies between the roundtrip time of the shortest cavity formed with the reflector that is the closest to the laser facet, and the longest one formed with the last Bragg reflector. This therefore complicates the cavity design from the degeneracy of harmonics mode-locking point of views and increases the differences between the bit-rates of the different emitted wavelengths. To reduce the complexity of designing transceivers, it is preferred to minimize the Bragg reflector length.

In order to relieve the above drawbacks, the length of each reflector should be short and consecutive reflectors should be closely spaced. This process eventually creates a chirped grating, assuming a monotonic increase or decrease of wavelengths from beginning to end of the reflector. Theoretically, when a chirped grating is used (instead of a discrete reflector for each wavelength), the source can emit any wavelength from the band of wavelengths reflected by the chirped grating. This should be done by continuously tuning of the driving modulation frequency. Due to the fact that the mode-locking process has a finite bandwidth, a given modulation frequency, $f_{Rf}$ (nominally equals $(c/n)/(2L_0)$ or any integer multiples of it, where c/n is the effective speed of light in the cavity and $L_0$ is a nominal cavity length) can produce mode locking for cavity whose length $L_0$ is not exactly matched; all the cavities of length in the range $L_0 \pm \Delta L$ will almost equally support mode-locking for the same driving frequency (the higher the cavity Q factor, the lower $\Delta L$). This fact raises wavelength stability problems for the extended cavity with the chirped grating; all the wavelengths that are found in the strip of width $\Delta L$ in the chirped grating are allowed. Thus, for a given driving modulation frequency, there is uncertainty in the actual emitted wavelength. Therefore, the possible continuous wavelength selection with a chirped grating reflector (which can be advantageous for some uses) needs some extra consideration and means to tune and stabilize the wavelength accurately to the precise needs of DWDM standards.

Therefore, it would be desirable to provide a system and method for a high-speed wavelength selection providing stabilized operation over a set of discrete wavelengths in a single laser source, to enable use of said system in dynamic wavelength division multiplexing communication methods and other systems.

SUMMARY OF THE INVENTION

Accordingly it is a principal object of the present invention to overcome the limitations of prior art wavelength switching systems and provide a system and a method that solves the above problems, described here for a semiconductor amplifier based laser, and which can be implemented for other kinds of lasers.

It is another object of the present invention to overcome the drawbacks of the prior art by utilizing a continuous chirped grating, and special design of the laser and amplifier system, In accordance with a preferred embodiment of the present invention, there is provided a wavelength tunable laser system comprising a complex laser cavity defined by a broadband reflective mirror at one end, and a chirped grating based mirror with varying associated Bragg wavelengths along the grating, at the other end.

The system also includes a gain element in the complex laser cavity, and a low finesse Fabry-Perot etalon element that can also function as the gain element. The Fabry-Perot etalon element having a well-defined length that is part of the laser cavity, such that its longitudinal modes match an optical frequency grid. The system also includes an active modulation element operable to provide mode-locking of the wavelength tunable laser system at one out of a discrete set of radio frequencies (RF), defined by the cavity lengths formed by the broadband reflective mirror and various portions of the chirped grating based mirror, wherein the varying associated Bragg wavelengths match the optical frequency grid.

In the preferred embodiment, a partial reflection coating (PRC) or an imperfect anti-reflection coating (ARC) is used in one facet of the semiconductor amplifier as compared to an almost perfect anti-reflection coating. This side of the laser amplifier is extended to a chirped, fiber-grating reflector. The other facet has a regular broadband high reflection (HR) coating. The length of the semiconductor amplifier is selected such that the spacing ΔF between its longitudinal modes matches the standard ITU spacing, which is 100 GHz, or any other nonstandard or sub-spacing, such as 50 GHz or even 25 GHz. More specifically, the length is taken to be: $L_{sc}=(c/n_{sc})/(2\Delta F)$, where $L_{sc}$ and $n_{sc}$ are the semiconductor length and its index of refraction, respectively. The partially reflecting layer together with the HR coating layer, forming the Fabry-Perot etalon laser diode of length $L_{sc}$, function as a periodic filter that effectively modulates the gain curve of the semiconductor amplifier with the required frequency spacing ΔF. This shape of gain curve represents the introduction of a wavelength stabilization mechanism for the extended cavity. It is most likely, that when a wavelength is selected by modulating the gain medium with the RF frequency that matches the extended cavity defined by a small section of the grating with the selected Bragg wavelength (or optical frequency), the peak in the gain curve that is the closest to the selected wavelength will be excited. By controlling the temperature and DC bias current of the semiconductor amplifier, these peaks in the effective gain curve can be placed accurately at their required location, and in that way the plurality of possible emitted wavelengths are fixed accordingly.

Other features and advantages of the invention will become apparent from the following drawings and the description.

BRIEF DESCRIPTION OF THE DRAWINGS

For a better understanding of the invention with regard to the embodiments thereof, reference is made to the accompanying drawings, in which like numerals designate corresponding elements or sections throughout, and in which.

DETAILED DESCRIPTION OF THE PREFERRED EMBODIMENTS

Figure 1:
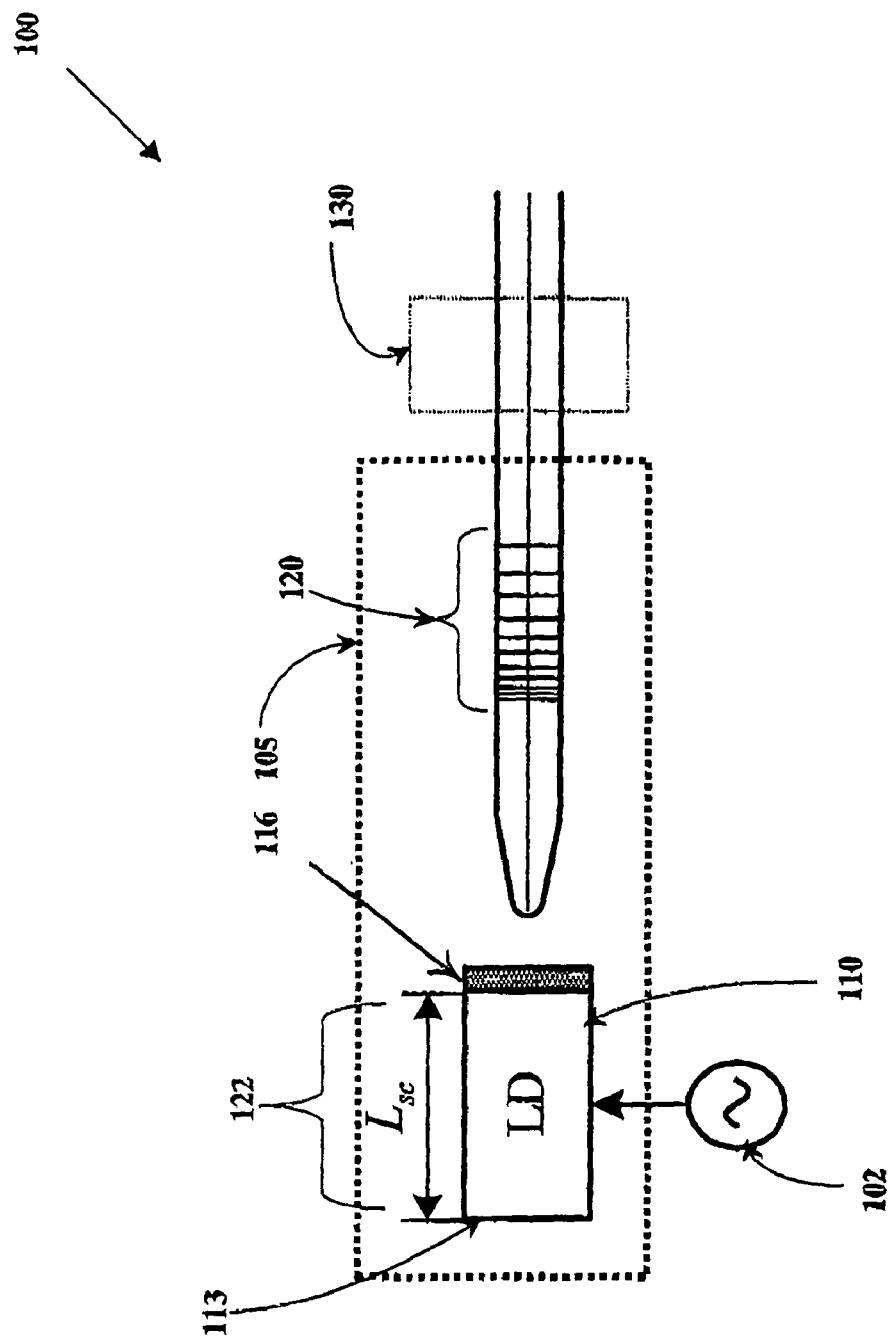
FIG. 1 is a schematic illustration of an exemplary embodiment a system for wavelength tunable optical transmitter, constructed and operated according to the principles of the present invention.

Referring now to FIG. 1, there is shown a schematic illustration of an exemplary embodiment a system 100 for wavelength tunable optical transmitter, constructed and operated according to the principles of the present invention.

System 100 shows a laser cavity 105 having a laser diode 110, for use as the gain element, with a chirped grating 120. Laser diode 110 has at one end a broad band high reflective coating (HRC) 113, and at the other end a partial reflective coating (PRC) 116 to allow interaction with chirped grating 120, thus extending the laser diode cavity 110 to chirped grating 120. The laser is an active modulation element using a biased sinusoidal current source 102 with a frequency $f_{RF}$, that provides the mode-locking for the specific cavity length formed by HRC 113 mirror, and a portion of the chirped grating located at integer multiples of $L=(c/n)/(2nf_{RF})$ from HRC 113. The central reflectivity of this portion determines the laser-emitted wavelength.

Alternatively, instead of directly modulating the gain element, mode-locking can be achieved by adding an active modulation element into the cavity, with which the cavity loss is modulated with an appropriate $f_{RF}$ frequency.

Selection is made for the length of semiconductor amplifier 110, such that the spacing ΔF between its longitudinal modes matches the standard International Telecommunications Union (ITU) spacing, which is 100 GHz, or multiples of it, such as 200 GHz, or any other non-standard spacing such as 50 GHz or oven 25 GHz. More specifically, the length is taken to be: $L_{sc}(c/n_{sc})/(2\Delta F)$, where $L_{sc}$ and $n_{sc}$ are the semiconductor amplifier length 122 and its index of refraction, respectively. PRC 116 and HRC 113, separated by the given laser diode of exemplary length $L_{sc}$ 122, function together as a low finesse Fabry-Perot etalon, i.e., as a periodic filter whose transmission peaks lay on the ΔF spacing frequency grid illustrated in FIG. 2. In order to apply information to the resulting stream of pulses an external modulator 130 should be used.

Figure 2:
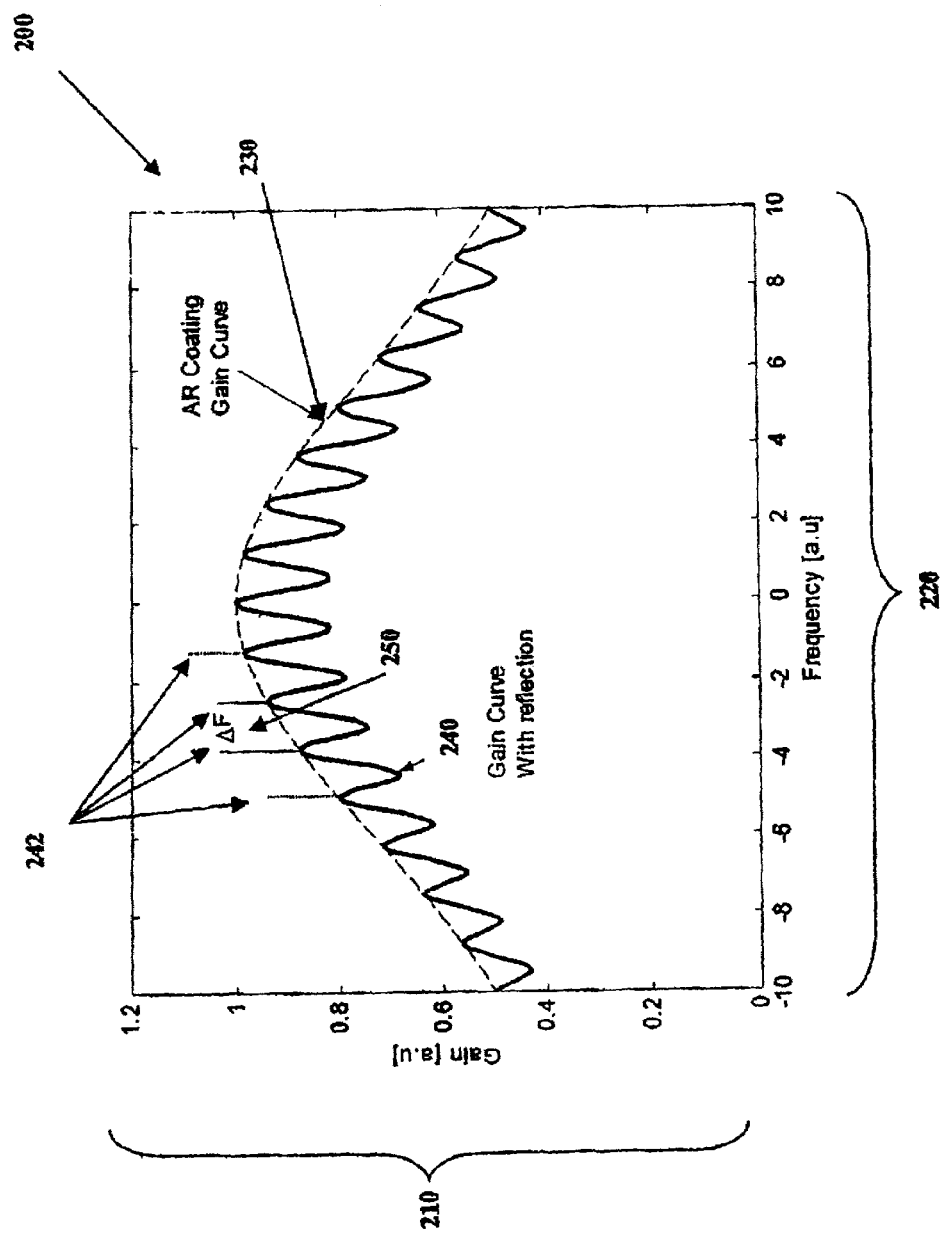
FIG. 2 is a graph of effective gain vs. frequency for the system of FIG. 1.

FIG. 2 is a graph 200 of a typical effective gain 210 vs. frequency 220 for the system of FIG. 1, as measured in arbitrary units (a.u.). The shape of effective gain curve 240, compared to the inherent semiconductor gain curve 230, represents a wavelength stabilization mechanism. The gain curve is not smooth, but gives rise to many different peaks 242, which lay along the frequency grid. It is most likely that when a wavelength is selected by performing active mode locking with an appropriate modulation frequency, the peak in the gain curve that is the closest to the selected wavelength will be excited. By controlling the temperature and/or the DC bias current of semiconductor amplifier 110, peaks 242 in the effective gain curve can be placed accurately at their required location, and in that way the plurality of possible emitted wavelengths are fixed accordingly. Thus, wavelength stabilization of diode laser system 100 is achieved, which is important for communications purposes.

Commercial lasers need to be stable over time for a frequency grid compatible with ITU standards.

Figure 3:
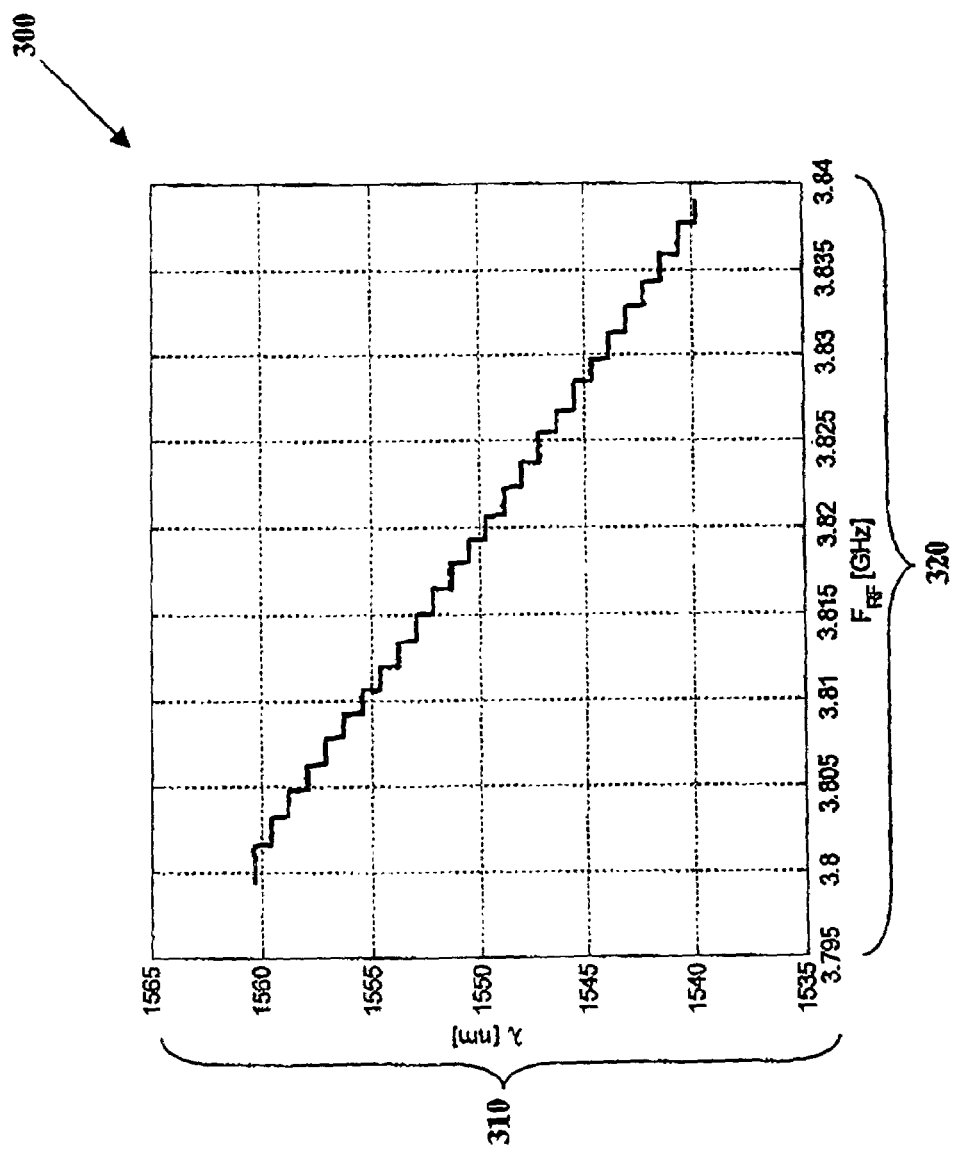
FIG. 3 is a graph of wavelength vs. applied mode locking frequency typically obtained from the tunable laser system of FIG. 1.

FIG. 3 shows a graph of typical experimental results 300 obtained from a tunable laser system based on the system of FIG. 1. The uniform staircase dependency of emitted wavelength 310 as function of mode-locking frequency 320 clearly demonstrates the phenomenon of wavelength stabilization. For this experiment the laser chip length was chosen to stabilize the emitted wavelengths to the ITU standard grid (about 0.8 nm or 100 GHz separation), the grating was a linearly chirped one, 1 cm long, 20% reflection coefficient and it occupies the 1540 to 1560 nm frequency band.

In prior art systems, information bits were applied directly on the mode-locking pulses, which are provided as a train of short pulses of light. In order to apply information on this stream of pulses, external modulator 130 should be used. However, since for every wavelength there is an associated different mode-locking frequency, the repetition rate of the pulses is different. This means that the external modulation has to be synchronized to the optical pulses, whose repetition rate is different for each wavelength, according to the mode-locking frequency chosen. This complicates the needed electronics for implementing the transmitter, although it can provide in some cases another potential dimension for a communication network system, where the different bit rate frequency can be used to differentiate between the different channels.

In accordance with the present invention, a much simpler approach for using the inventive tunable laser is to consider it as a CW light source, and modulate it with information whose rate is lower than half the mode-locking pulse repetition rate. For this kind of modulation scheme, herein defined as a quasi-CW modulation scheme, the receiver bandwidth should match the information bandwidth, thus leaving the mode-locking spectral lines out of the receiving window. This averages out the mode-locking pulses and generates a standard NRZ received signal that could be processed using standard commercial receivers. Using this scheme, there is no need to synchronize the information bits to the mode-locking pulse train. The price paid is, that for a given information rate the mode-locking rate should be at least twice faster, and that the occupied bandwidth in the optical domain is higher compared to the one obtained for a CW modulated one.

Having described the invention with regard to certain specific embodiments thereof, it is to be understood that the description is not meant as a limitation, since further modifications may now suggest themselves to those skilled in the art, and it is intended to cover such modifications as fall within the scope of the appended claims.

I claim:

1. A stabilized grid wavelength tunable laser system comprising:

a complex laser cavity defined by a broadband reflective mirror at one end, and a chirped grating based mirror with varying associated Bragg wavelengths along said grating, at the other end;

a gain element in said complex laser cavity, and in addition, a low finesse Fabry-Perot etalon element that can also function as said gain element, said Fabry-Perot etalon element having a well-defined length that is part of said complex laser cavity, such that longitudinal modes of said Fabry-Perot etalon element match a resulting fixed optical frequency grid having equal spacing between its grid lines; and an active modulation element operable to provide mode-locking, and thereby to emit a train of pulses of light, said active modulation element being operated at one of a discrete set of radio frequencies (RF), defined by the cavity lengths formed by said broadband reflective mirror and various portions of said chirped grating based mirror, such that the combination of said low finesse Fabry-Perot etalon element, together with said RF-based active modulation element, provides stabilized laser action at one optical frequency of said fixed optical frequency grid, in a tunable fashion.

2. The system of claim 1, wherein said spacing of said optical frequency grid lines is in multiples of 100 GHz.

3. The system of claim 1, wherein said spacing of said optical frequency grid lines is in multiples of 100 GHz divided by an integer.

4. The system of claim 1, wherein said laser gain element is a Fabry-Perot semiconductor amplifier having one facet, which functions as said broadband reflective mirror, and having another facet with a partial reflection coating, which is adhered to said chirped grating based mirror.

5. The system of claim 1, wherein said longitudinal modes, associated with said defined length, correspond to the standard ITU (International Telecommunication Union) optical frequency grid determined for fiber optic communications.

6. The system of claim 5, wherein said spacing of said optical frequency grid lines is multiples of 100 GHz.

7. The system of claim 5, wherein said spacing of said optical frequency grid lines is in multiples of 100 GHz divided by an integer.

8. The system of claim 1, wherein said active modulation element is operated via gain switching of said gain element mode to provide said mode locking of said laser system.

9. The system of claim 1, wherein said chirped grating has a continuous chirp.

10. The system of claim 9, wherein said grating is a sampled chirped grating.

11. The system of claim 10, wherein said sampled chirped grating has a reflection spectrum that matches said optical frequency grid.

12. The system of claim 1, wherein said chirped grating is stepwise.

13. The system of claim 1, used as a quasi-continuous wave tunable laser system in a communication link, wherein said RF frequencies, and thus the rates of said emitted pulses from said laser are higher than the bit rate used in a communication link.

14. The system of claim 1, used in a communication network, wherein said different RF frequencies of said discrete set of RF frequencies, and thus the different rates of said emitted pulses from said laser, are used to differentiate different channels in the communication network.

15. The system of claim 1, wherein said active modulation element is said gain element directly actively modulated.

16. A stabilized grid wavelength tunable laser apparatus comprising:

a complex laser cavity defined by a broadband reflective mirror at one end, and a chirped grating based mirror with varying associated Bragg wavelengths along said grating, at the other end;

a gain element in said complex laser cavity, and in addition, a low finesse Fabry-Perot etalon element that can also function as said gain element, said Fabry-Perot etalon element having a well-defined length that is part of said complex laser cavity, such that longitudinal modes of said Fabry-Perot etalon element match a resulting fixed optical frequency grid having equal spacing between its grid lines; and an active modulation element operable to provide mode-locking of said wavelength tunable laser apparatus at one of a discrete set of radio frequencies (RF), defined by the cavity lengths formed by said broadband reflective mirror and various portions of said chirped grating based mirror, such that the combination of said low finesse Fabry-Perot etalon element, together with said RF-based active modulation element, provides stabilized laser action at one optical frequency of said fixed optical frequency grid, in a tunable fashion.

17. The apparatus of claim 16, wherein said spacing of said optical frequency grid lines is in multiples of 100 GHz.

18. The apparatus of claim 16, wherein said spacing of said optical frequency grid lines is in multiples of 100 GHz divided by an integer.

19. The apparatus of claim 16 wherein said laser gain element is a Fabry-Perot semiconductor amplifier having one facet which functions as said broadband reflective mirror, and having another facet with a partial reflection coating, which is adhered to said chirped grating based mirror.

20. The apparatus of claim 16, wherein said longitudinal modes associated with said defined length, correspond to the standard ITU (International Telecommunication Union) optical frequency grid determined for fiber optic communications.

21. The apparatus of claim 20, wherein the spacing of said optical frequency grid is multiples of 100 GHz.

22. The apparatus of claim 20, wherein the spacing of said optical frequency grid is multiples of 100 GHz divided by an integer.

23. The apparatus of claim 16, wherein said active modulation element is operated via gain switching of said gain element mode to provide said mode locking of said laser apparatus.

24. The apparatus of claim 16, wherein said chirped grating has a continuous chirp.

25. The apparatus of claim 24, wherein said grating is a sampled chirped grating.

26. The apparatus of claim 25, wherein said sampled chirped grating has a reflection spectrum that matches said optical frequency grid.

27. The apparatus of claim 15, wherein said chirped grating is stepwise.

28. The apparatus of claim 16, used as a quasi-CW tunable laser system in a communication link, wherein said RF frequencies, and thus the rates of said emitted pulses from said laser, are higher than the bit rate used in a communication link.

29. The apparatus of claim 16, used in a communication network, wherein said different RF frequencies of said discrete set of RF frequencies, and thus the different emitted pulse rates from said laser, are used to differentiate different channels in the communication network.

30. The system of claim 16, wherein said active modulation element is said gain element directly actively modulated.

31. A method for a stabilized grid wavelength tunable laser system comprising:

providing a complex laser cavity defined by a broadband reflective mirror at one end, and a chirped grating based mirror with varying associated Bragg wavelengths along said grating, at the other end;

providing a gain element in said complex laser cavity, and in addition, a low finesse Fabry-Perot etalon element that can also function as said gain element, said Fabry-Perot etalon element having a well-defined length that is part of said complex laser cavity, such that longitudinal modes of said Fabry-Perot etalon element match a resulting fixed optical frequency grid having equal spacing between its grid lines; and providing an active modulation element operable to provide mode-locking of said wavelength tunable laser system at one of a discrete set of radio frequencies (RF), defined by the cavity lengths formed by said broadband reflective mirror and various portions of said chirped grating based mirror, such that the combination of said low finesse Fabry-Perot etalon element, together with said RF-based active modulation element, provides stabilized laser action at one optical frequency of said fixed optical frequency grid, in a tunable fashion.

32. The method of claim 31, wherein said optical frequency grid comprises spacing between grid lines in multiples of 100 GHz.

33. The method of claim 31, wherein said optical frequency grid comprises spacing between grid lines in multiples of 100 GHz divided by an integer.

34. The method of claim 31, wherein said laser gain element is a Fabry-Perot semiconductor amplifier having one facet which functions as said broadband reflective mirror, and having another facet with a partial reflection coating, which is adhered to said chirped grating based mirror.

35. The method of claim 31, wherein said longitudinal modes associated with said defined length, correspond to the standard ITU (International Telecommunication Union) optical frequency grid determined for fiber optic communications.

36. The method of claim 35, wherein the spacing of said optical frequency grid is multiples of 100 GHz.

37. The method of claim 35, wherein the spacing of said optical frequency grid is multiples of 100 GHz divided by an integer.

38. The method of claim 31, wherein said active modulation element is operated via gain switching of said gain element mode to provide said mode locking of said laser system.

39. The method of claim 31, wherein said chirped grating has a continuous chirp.

40. The method of claim 39, wherein said grating is a sampled chirped grating.

41. The method of claim 40, wherein said sampled chirped grating has a reflection spectrum that matches said optical frequency grid.

42. The method of claim 31, wherein said chirped grating is stepwise.

43. The method of claim 31, used as a quasi-CW tunable laser system in a communication link, wherein said RF frequencies, and thus the rates of said emitted pulses from said laser, are higher than the bit rate used in a communication link.

44. The method of claim 31, used in a communication network, wherein said different RF frequencies of said discrete set of RF frequencies, and thus the different emitted pulse rates from said laser, are used to differentiate different channels in the communication network.

45. The system of claim 31, wherein said active modulation element is said gain element directly actively modulated.

* * * * *